(12) United States Patent
Amiri et al.

(10) Patent No.: US 10,396,788 B2
(45) Date of Patent: Aug. 27, 2019

(54) LOW POWER MULTILEVEL DRIVER

(71) Applicant: Kandou Labs, S.A., Lausanne (CH)

(72) Inventors: Omid Talebi Amiri, Chavannes-pres-Renens (CH); Richard Simpson, Bedford (GB)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/107,829

(22) Filed: Aug. 21, 2018

(65) Prior Publication Data

US 2018/0358967 A1  Dec. 13, 2018

Related U.S. Application Data

(63) Continuation of application No. 15/582,550, filed on Apr. 28, 2017, now Pat. No. 10,056,903.

(60) Provisional application No. 62/328,722, filed on Apr. 28, 2016.

(51) Int. Cl.
*H04B 3/04* (2006.01)
*H03K 19/00* (2006.01)

(52) U.S. Cl.
CPC .......... *H03K 19/0005* (2013.01); *H04B 3/04* (2013.01)

(58) Field of Classification Search
CPC ............... H03K 19/0005; H04B 3/04
USPC ......................................................... 326/30
See application file for complete search history.

(56) References Cited

U.S. PATENT DOCUMENTS

| | | |
|---|---|---|
| 5,539,360 A | 7/1996 | Vannatta et al. |
| 6,172,634 B1 | 1/2001 | Leonowich et al. |
| 6,424,630 B1 | 7/2002 | Ang |
| 6,772,351 B1 | 8/2004 | Werner et al. |
| 7,038,486 B2 * | 5/2006 | Aoyama ................. H03H 11/30 326/108 |
| 7,093,145 B2 | 8/2006 | Werner et al. |
| 7,130,944 B2 | 10/2006 | Perino et al. |
| 7,176,823 B2 | 2/2007 | Zabroda |
| 7,269,212 B1 | 9/2007 | Chau et al. |
| 7,456,778 B2 | 11/2008 | Werner et al. |
| 7,462,956 B2 | 12/2008 | Lan et al. |
| 7,570,704 B2 | 8/2009 | Nagarajan et al. |
| 7,768,312 B2 | 8/2010 | Hirose |
| 7,826,551 B2 | 11/2010 | Lee et al. |
| 7,859,356 B2 | 12/2010 | Pandey |
| 8,040,200 B2 | 10/2011 | Minegishi et al. |

(Continued)

FOREIGN PATENT DOCUMENTS

CN 101478286 A 7/2009

*Primary Examiner* — Daniel D Chang

(74) *Attorney, Agent, or Firm* — Invention Mine LLC

(57) ABSTRACT

A driver for transmitting multi-level signals on a multi-wire bus is described that includes at least one current source connected to a transmission line, each current source selectively enabled to source current to the transmission line to drive a line voltage above a termination voltage of a termination voltage source connected to the transmission line via a termination impedance element, wherein each of the at least one current sources has an output impedance different than a characteristic impedance of the transmission line, and at least one current sink connected to the transmission line, each current sink selectively enabled to sink current from the transmission line to drive a line voltage below the termination voltage, each of the at least one current sinks having an output impedance different than the characteristic impedance of the transmission line.

20 Claims, 6 Drawing Sheets

(56) References Cited

U.S. PATENT DOCUMENTS

| | | |
|---|---|---|
| 8,199,849 B2 | 6/2012 | Oh et al. |
| 8,284,848 B2 | 10/2012 | Nam et al. |
| 8,295,336 B2 | 10/2012 | Lutz et al. |
| 8,520,348 B2 | 8/2013 | Dong |
| 8,975,948 B2 | 3/2015 | Gonzalez Diaz |
| 9,362,974 B2 | 6/2016 | Fox et al. |
| 9,544,015 B2 | 1/2017 | Ulrich |
| 9,710,412 B2 * | 7/2017 | Sengoku .................. H04L 5/20 |
| 9,917,711 B2 | 3/2018 | Ulrich |
| 2001/0006538 A1 | 7/2001 | Simon et al. |
| 2002/0125933 A1 | 9/2002 | Tamura et al. |
| 2002/0149508 A1 | 10/2002 | Hamashita |
| 2002/0158789 A1 | 10/2002 | Yoshioka et al. |
| 2003/0085763 A1 | 5/2003 | Schrodinger et al. |
| 2007/0002954 A1 | 1/2007 | Cornelius et al. |
| 2007/0121716 A1 | 5/2007 | Nagarajan et al. |
| 2008/0012598 A1 | 1/2008 | Mayer et al. |
| 2008/0187037 A1 | 8/2008 | Bulzacchelli et al. |
| 2009/0002030 A1 | 1/2009 | Stojanovic et al. |
| 2009/0237109 A1 * | 9/2009 | Haig .................. H03K 19/0005 326/30 |
| 2010/0156691 A1 | 6/2010 | Taft |
| 2010/0220828 A1 | 9/2010 | Fuller et al. |
| 2012/0125665 A1 | 5/2012 | Masuda |
| 2012/0133438 A1 | 5/2012 | Tsuchi et al. |
| 2013/0307614 A1 | 11/2013 | Dai |
| 2013/0322512 A1 | 12/2013 | Francese et al. |
| 2014/0159769 A1 | 6/2014 | Hong et al. |
| 2015/0319015 A1 | 11/2015 | Malhotra |
| 2015/0349835 A1 | 12/2015 | Fox et al. |
| 2015/0381232 A1 | 12/2015 | Ulrich |

* cited by examiner

LOW POWER MULTILEVEL DRIVER

CROSS REFERENCE TO RELATED APPLICATIONS

This application is a continuation of U.S. application Ser. No. 15/582,550, filed Apr. 28, 2017, naming Omid Talebi Amiri and Richard Simpson, entitled "Low Power Multilevel Driver", which claims the benefit of U.S. Provisional Application No. 62/328,722, filed Apr. 28, 2016, naming Omid Talebi Amiri and Richard Simpson, entitled "Low Power Multilevel Driver," all of which are hereby incorporated by reference in their entirety for all purposes.

REFERENCES

The following prior applications are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter identified as [Cronie I]);

U.S. Pat. No. 9,100,232, issued Aug. 4, 2015, naming Amin Shokrollahi, Ali Hormati, and Roger Ulrich, entitled "Method and Apparatus for Low Power Chip-to-Chip Communications with Constrained ISI Ratio" (hereinafter identified as [Shokrollahi I]);

U.S. patent application Ser. No. 14/315,306, filed Jun. 25, 2014, naming Roger Ulrich, entitled "Multilevel Driver for High Speed Chip-to-Chip Communications" (hereinafter identified as [Ulrich I]).

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives signal or signals approximating those transmitted (as the result of signal degradation over the link, noise, and other distortions.) The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires used for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is 2^8, or 256. As with SES or DS links, output drivers used with a binary vector signaling code need only emit two distinct voltage- or current-levels, corresponding to the two possible coordinate values for each vector element.

With non-binary vector signaling, each component has a coordinate value that is a selection from a set of more than two possible values. A "non-binary vector signaling code" refers to a mapping and/or set of rules to map information bits to non-binary vectors. The corresponding output driver for a non-binary vector signaling code may then be configured to emit multiple voltage- or current-levels corresponding to the selected coordinate values for each vector output. Examples of vector signaling methods are described in [Cronie I].

BRIEF DESCRIPTION

A transmitter and receiver can communicate using a serial communications link, wherein the serial communications link uses signaling based on a balanced vector signaling code. The vector signaling code transmits a vector of symbols using multiple wires of the communications link in each transmit unit interval. The number of components of the vector can be two, three, four, or more than four. The number of coordinate values for a component can be two, three, four, or more than four. For example, a link might use four components with four possible coordinate values: a high value, a low value, and inverses of the high and low values, such that a signal having the high value cancels out three signals having the inverse of the low value and a signal having the inverse of the high value cancels out three signals having the low value and, in this manner, the link can convey three bits in a signal period using those four components by mapping the eight possible three bit combinations onto the eight vector code words represented by the four permutations of one high value and three inverses of the low value plus the four permutations of the inverse of one high value and three low values. In a more specific embodiment, the high and low values are voltage values and relative to a reference, the high value and its inverse have the same magnitude but opposite signs, the low value and its inverse have the same magnitude but opposite signs, and the high value has a magnitude three times the low value. As another example, a different link might use three components chosen from three possible coordinate values: a positive value, a smaller positive value, and a smallest positive value or zero, such that the sum of all vector component values is a constant. Such a code is also balanced, albeit with an additional offset or DC component superimposed upon all possible coordinate values as is common practice in embodiments relying on single-ended power supplies.

In at least one embodiment, a driver for transmitting multi-level signals on a multi-wire bus is described that includes at least one current source connected to a transmission line, each current source selectively enabled to source current to the transmission line to drive a line voltage above a termination voltage of a termination voltage source connected to the transmission line via a termination impedance element, wherein each of the at least one current sources has an output impedance different than a characteristic impedance of the transmission line, and at least one current sink connected to the transmission line, each current sink selectively enabled to sink current from the transmission line to drive a line voltage below the termination voltage, each of the at least one current sinks having an output impedance different than the characteristic impedance of the transmission line.

In some embodiments, the termination impedance is matched to the characteristic impedance of the transmission line. In some embodiments, the apparatus further comprising at least one transmit impedance element connecting at least one current source or at least one current sink to the transmission line. In some embodiments, at least one transmit impedance connects both a current source and a current sink to the transmission line.

In some embodiments, each current source and current sink includes a corresponding switch configured to selectively enable sourcing or sinking of the current to the transmission line. In some embodiments, at least one of the current sources is an active current source connected to the transmission line via the corresponding switch. In some embodiments, at least one current sink is a resistive element connected to the transmission line.

In some embodiments, the transmission line corresponds to a single wire of a multi-wire bus, each wire of the multi-wire bus connected to the termination voltage node by a corresponding termination impedance. In some embodiments, the apparatus further includes a switching circuit connected to a single current source or a current sink, the switching circuit configured to connect the single current source or current sink to one or more of the wires of the multi-wire bus. In some embodiments, the at least one current source and the at least one current sink are configured to collectively form at least three possible line voltage values.

In accordance with at least one embodiment, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a quaternary signaling system wherein each wire signal has one of four values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter.

DETAILED DESCRIPTION

Figure 1:
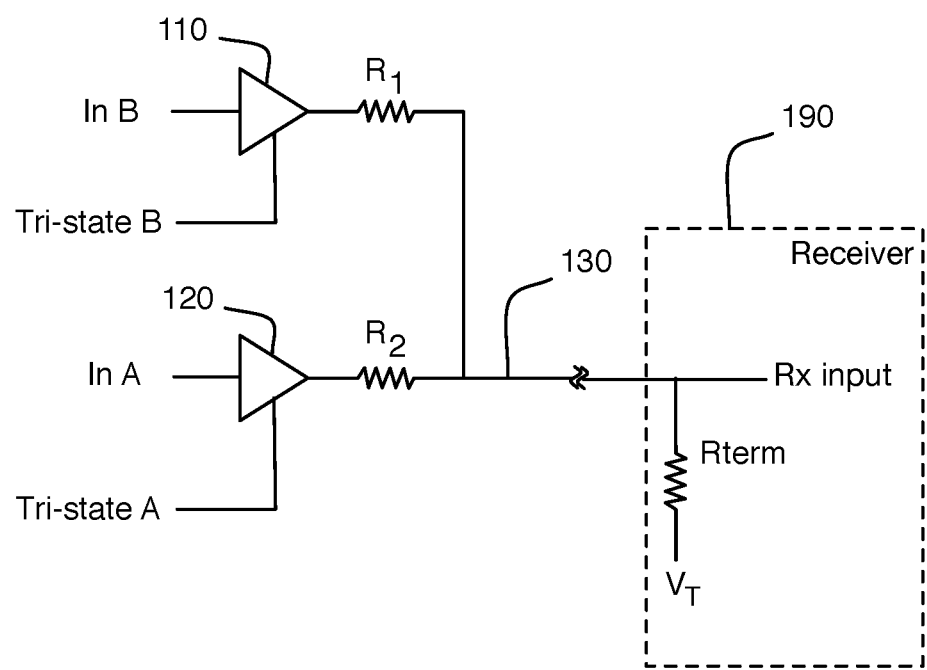
FIG. 1 is a schematic diagram of one embodiment of a multilevel line driver.

Despite the increasing technological ability to integrate entire systems into a single integrated circuit, multiple chip systems and subsystems retain significant advantages. For purposes of description and without limitation, example embodiments described herein assume a systems environment of at least one point-to-point communications interface connecting two integrated circuit chips representing a transmitter and a receiver, wherein the communications interface is supported by at least one interconnection group of more than two high-speed transmission line signal wires providing medium loss connectivity at high speed, a vector signaling code carries information from the transmitter to the receiver as simultaneously transmitted values on each wire of a group with individual values being selected from three or more levels and, the overall group is constrained by the vector signaling code to a fixed sum of levels.

Thus in one embodiment, symbol coordinate values of the H4 vector signaling code first described in [Cronie I] are transmitted as offset voltage levels from a fixed reference, as one example a +200 mV offset representing a "+1", a −66 mV offset representing a "−⅓", etc.

Physical Channel Characteristics

As one example of a high speed communication system, communication elements may be interconnected via a communications channel composed of at least one group of microstripline wires separated by a dielectric layer from a ground plane, providing a controlled impedance multiwire transport suitable for use with a vector signaling code. The multiple wires of the group are routed together with homogenous fabrication characteristics, to minimize variations in attenuation and propagation velocity. Further, each wire in this channel is terminated at each end in its characteristic transmission line impedance. Thus, following conventional good practice for a typical transmission line impedance of 50 ohms, signals are issued by a transmitter having a source impedance of 50 ohms, and are detected at the receiver as voltages across or current through a 50 ohm termination resistance. Current practice supports communication over such channels at rates up to tens of Gigabits per second, over distances ranging from several centimeters to a meter or more.

[Ulrich I] describes line driver embodiments compatible with these conventional channels, providing multiple signal output levels with matched output impedance, and optional Finite Impulse Response waveform shaping. [Shokrollahi I] similarly describes transmitters and receivers capable of communicating at 25 Gigabits per second per communications channel wire, over distances of up to 25 millimeters.

However, applying these practices to shorter channels may result in unnecessary power consumption and system complexity. The short propagation times and minimal transmission line variations seen in an interconnection within a single integrated circuit device may not use perfectly matched terminating impedances to permit error-free communication to occur. Thus, the embodiments described herein offer reduced line driver power consumption in those environments where matched line terminations are not implemented.

For purposes of illustration and without implying limitation, channels associated with subsequent embodiments described herein may be composed of 50 ohm impedance interconnections routed as wire groups of six to eight wires of equal length not exceeding two millimeters (e.g. between two subsystems on a single integrated circuit device, or between two integrated circuits within a multi-chip module) operating at data rates of up to 25 Gigabits per second per wire using the receivers and vector signaling code described in [Shokrollahi I.]

Low Power Line Driver

A first embodiment of a line driver suitable for generation of up to four discrete output signal levels on a single wire is shown in the schematic of FIG. 1. Output drivers 110 and 120 are conventional CMOS tri-state output devices, e.g. capable of both sourcing and sinking current using a stacked PMOS/NMOS output structure, or presenting a high-impedance output in which neither output transistor is enabled.

Each output level is produced by enabling one output driver and setting its input to either a logic "1" or a logic "0". Series resistors $R_1$ and $R_2$ form a voltage divider with termination resistor $R_{term}$, thus the output levels seen at 130 will be a fraction of the Vdd-to-Vss output voltage swing produced by driver 110 or driver 120 at their outputs. Four output levels are possible: $R_1$ driven high, $R_2$ driven high, $R_2$ driven low, and $R_1$ driven low.

In one embodiment, $R_1$=50 ohms, $R_2$=250 ohms, and $R_{term}$=50 ohms, With Vdd=0.9 volts, output levels of 675, 525, 375, and 225 mV were obtained in that particular embodiment.

Figure 5:
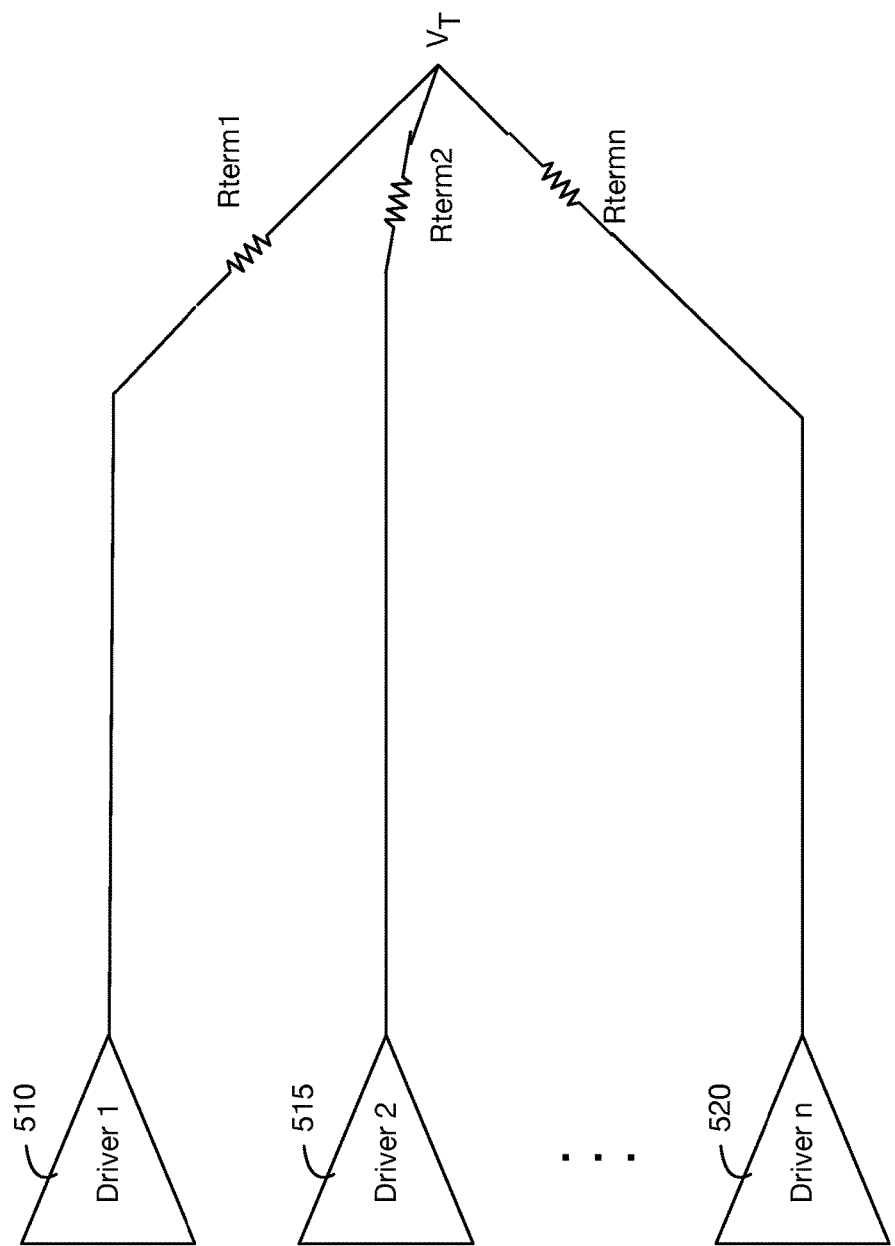
FIG. 5 is a block diagram of a multi-transmission line communication system, in accordance with some embodiments.

Termination voltage $V_T$ represents the mid-point of the transmit output levels and thus the midpoint or bias level for Receiver 190 as well. As the example Glasswing code of [Shokrollahi I] is a balanced six wire code (i.e. all elements of that code summing to a constant value for all codewords) the six instances of FIG. 1 needed to drive the six wires may be interconnected at node $V_T$, with the termination voltage produced by the passive summation of the currents flowing through each wire's Rterm to the common connection at node $V_T$, with no need for a separate termination voltage source. At least one embodiment provides a bypass capacitor between that common connection node for all termination resistors and ground. FIG. 5 illustrates an exemplary embodiment in which n drivers 510, 515, . . . , 520 are connected to the termination voltage node via corresponding termination impedance elements Rterm1, Rterm2, . . . , Rtermn.

This circuit provides significant power savings over the multilevel output driver of [Ulrich I] but does not provide a constant source impedance facing 130. Thus, there is more risk of signal reflections causing inter-symbol interference, especially if the transmission path round trip time is an appreciable fraction of a transmission unit interval. However, this will rarely be the case for extremely short channels, while the potential power savings will be of significant importance.

Figure 2:
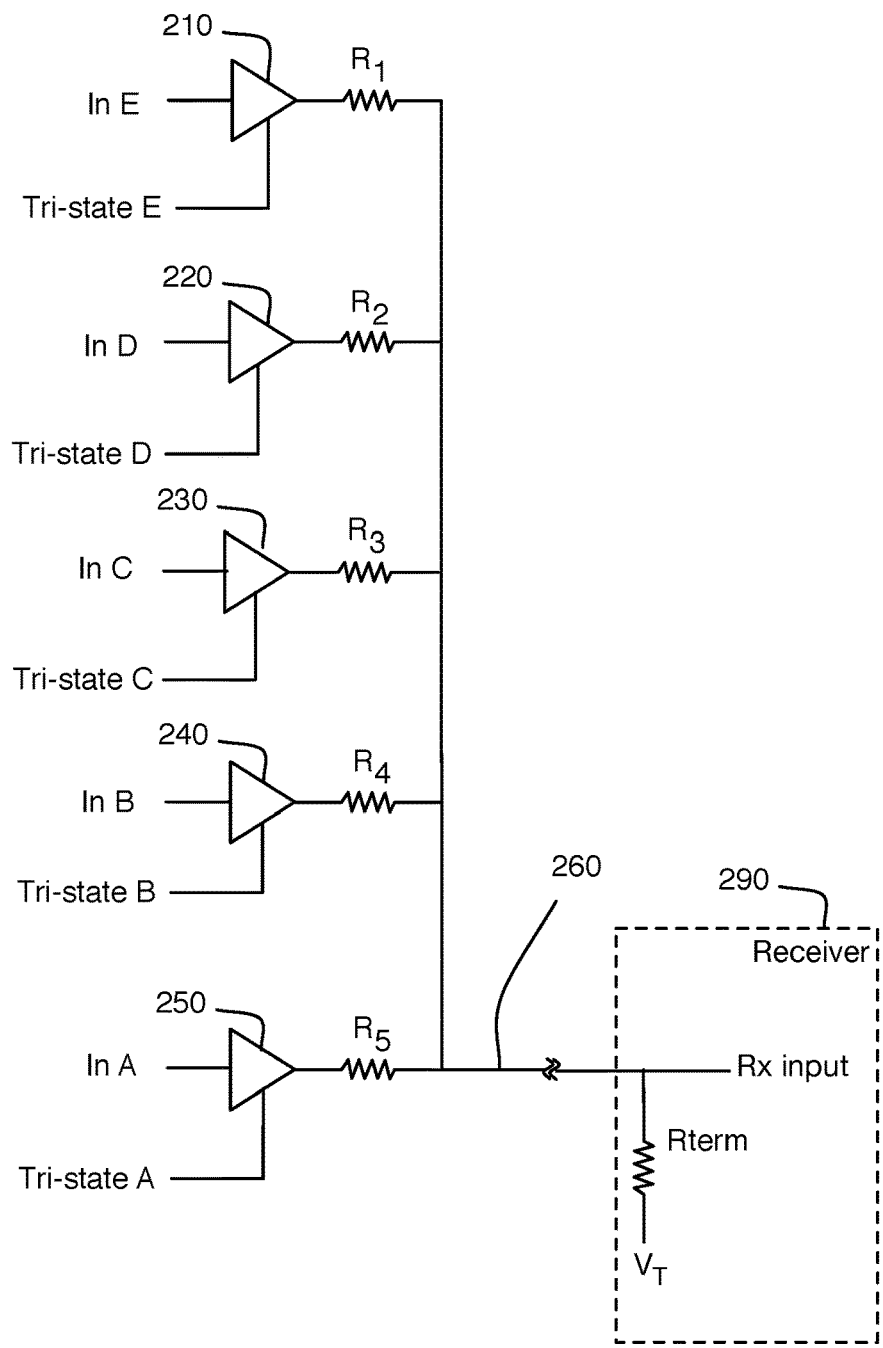
FIG. 2 is a schematic diagram of another embodiment of a multilevel line driver.

Illustrating that this technique is extensible, a further embodiment is shown in the schematic diagram of FIG. 2, with five tri-stateable CMOS buffers 210, 220, 230, 240, 250 with source resistors $R_1$, $R_2$, $R_3$, $R_4$, $R_5$ producing up to ten discrete signal levels at 260 and receiver 290. As will be apparent from the two examples given, additional embodiments may be designed which support different signaling levels, different numbers of signaling levels, and different numbers of wires.

Hybrid Line Driver

Figure 3:
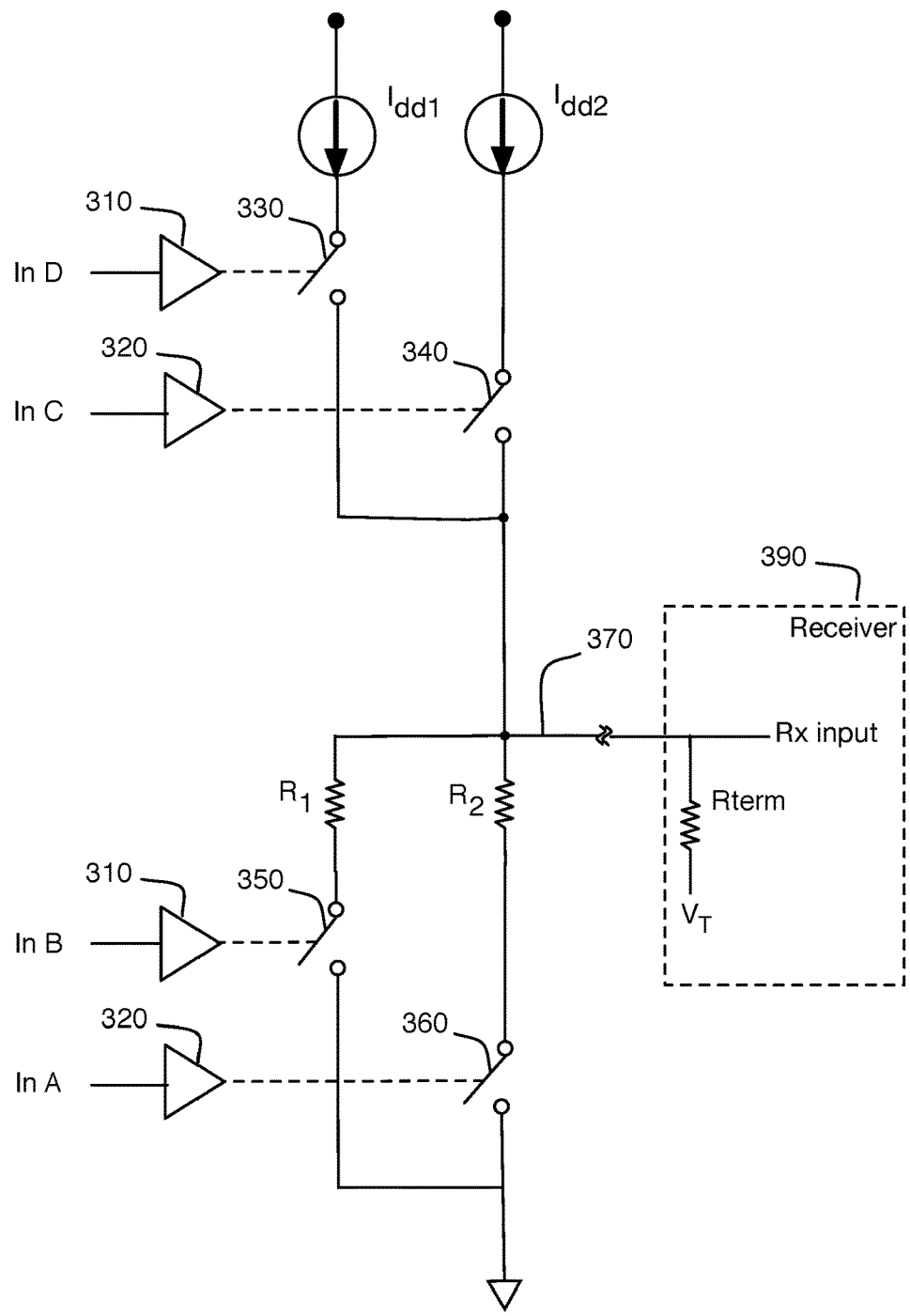
FIG. 3 is a schematic diagram of one embodiment of a multilevel line driver comprising both current source and resistive sink elements.

The line driver embodiment illustrated in the schematic of FIG. 3 may be configured to provide even lower power operation, again provided that the transmit impedance facing the output is not constrained. As with the previous examples, termination voltage $V_T$ represents the mid-point of the multiple transmit signal levels, as well as typically also the receiver bias point. Output voltage levels greater than termination voltage $V_T$ are produced by injecting current into node 370 by asserting InC or InD which in turn closes switch 330 or 340, thus connecting current source Idd1 or Idd2 to 370, with the additional current across Rterm raising the voltage at 370. Output voltage levels less than $V_T$ are produced by removing current from node 370 by asserting InA or InB which in turn closes switch 350 or 360, thus connecting transmit impedance resistors R1 or R2 to 370 and lowering the voltage seen across Rterm and thus by receiver 390. Although active current sinks can be used for current removal, practical design considerations favor the simpler approach of resistive current sinking. While it may be feasible to obtain 16 various voltage levels by selectively enabling and disabling inputs In A/B/C/D, some embodiments may utilize a subset. For example, for the Glasswing encoding scheme referenced below, only 1 input In A/B/C/D may be enabled at a time, producing the 4 possible voltage levels corresponding to symbol values ±1, ±⅓.

In one embodiment, switches 330, 340, 350, 360 are MOS transistors, and termination voltage $V_T$ at the termination voltage node is produced as previously described, by interconnecting each wire instance of FIG. 3 at $V_T$ with an optional bypass capacitor from that interconnection node to ground. In one particular embodiment, $R_1$=100 ohms, $R_2$=0 ohms, and $R_{term}$=50 ohms, with current sources of 3 mA and 1.5 mA. With Vdd=0.9 V, output levels of 450, 300, 150, and 0 mV were obtained in that particular embodiment.

Switched circuit elements are used to pass current from current sources Idd1 and Idd2, because in practice directly enabling/disabling of a current source has been found to be too slow. Such switching also suggests a further optimization. Just as the termination voltage $V_T$ appears as a consensus or aggregate result of the interconnection of all termination resistors from wires carrying a balanced vector signaling code, the characteristics of the code may be used to optimize the design and usage of the current sources Idd1 and Idd2. As one example, [Shokrollahi I] teaches that every Glasswing or 5b6w codeword contains exactly one "+1" symbol, and exactly two "+⅓" symbols. Thus, of the six instances of FIG. 3 (one instance for each of six wires) needed to output that code, only one will use the current source producing the "+1" output level, and exactly two will use the current source producing the "+⅓" level. Because of this consistent usage pattern, another embodiment uses a single "+1" current source across all six instances, and configures the associated selection switches as a "1 of 6" switching circuit, directing that current to the wire requiring that symbol value for the code word being output. Similarly, two current sources may be shared among six wires for the "+⅓" output level. (As an alternative embodiment, a single current source providing twice the current could potentially be shared between the two wires requiring a "+⅓" output, at the risk of uneven current sharing.) With the resistor and current values previously described for the particular embodiment, a total current consumption of 6 mA (one 3 mA current source shared among six wires, and two 1.5 mA current sources shared among six wires) will support an entire 5b6w interface. Similar optimizations may be obtained for other vector signaling codes.

Figure 4:
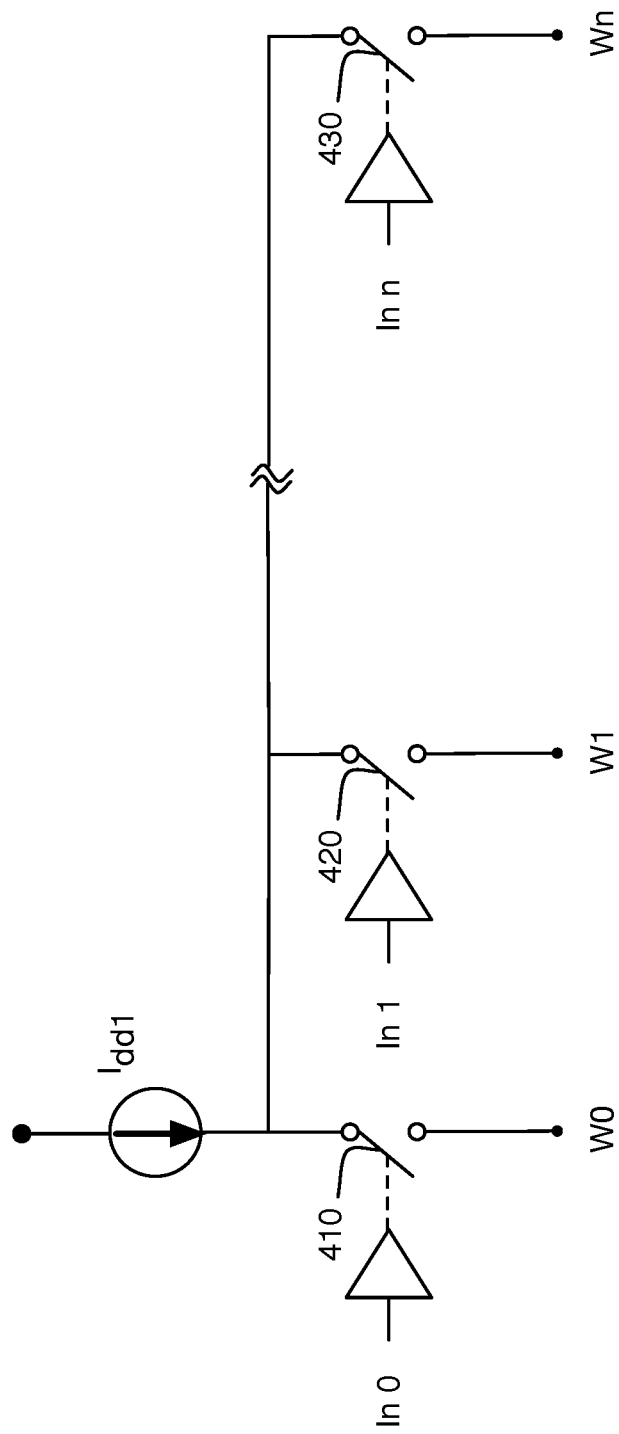
FIG. 4 is a switching circuit, in accordance with some embodiments.

FIG. 4 is a schematic of a switching circuit configured to direct the current of Idd1 to one of a plurality wires of the multi-wire bus. As shown, current source Idd1 is connect to n switches, each switch connected to a respective wire of the multi-wire bus. In the embodiment above where Idd1 corresponds to a "+1" symbol, only one of the switches 410/420/430 may be enabled at a given time. A similar circuit may be used for the current source corresponding to the "+⅓" symbol, as well as the current sinks corresponding to the "−1" and "−⅓" symbols. Alternatively, current source Idd1 may correspond to a value of "+⅔", and may be simultaneously connected to two wires, providing each wire with a level of "+⅓".

Figure 6:
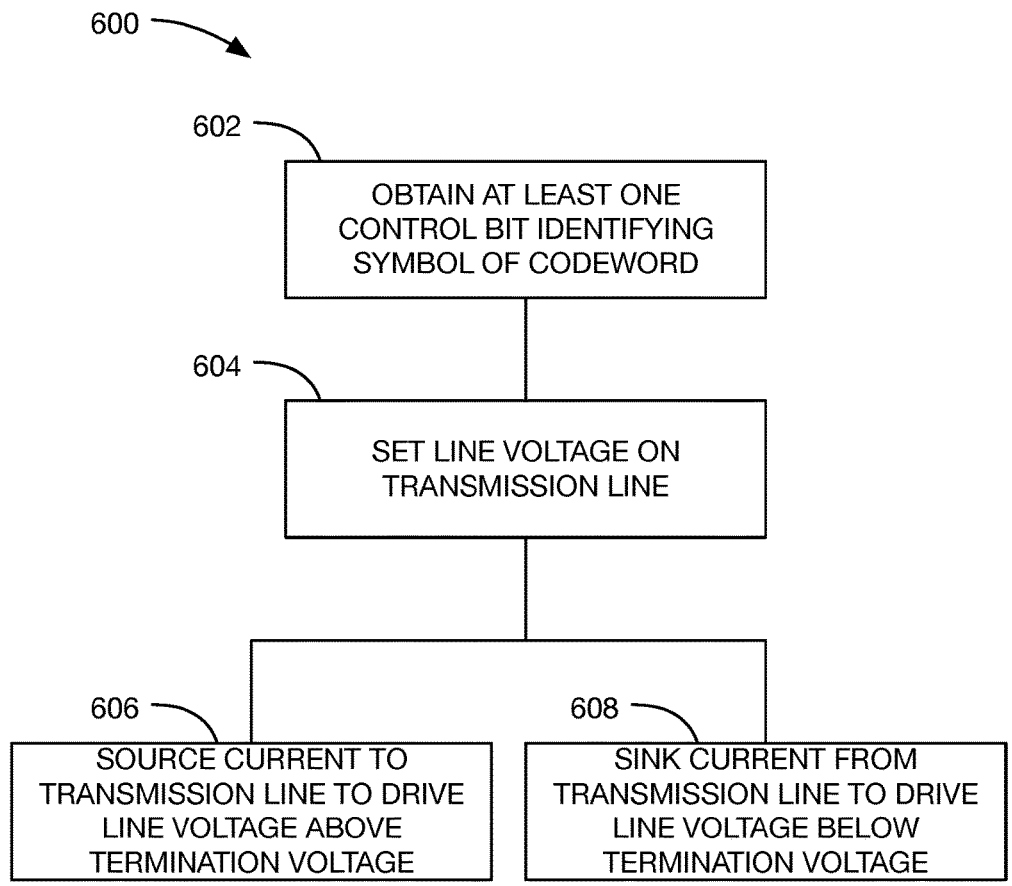
FIG. 6 is a flowchart of a method, in accordance with some embodiments.

FIG. 6 is a flowchart of a method 600, in accordance with some embodiments. As shown, FIG. 6 includes obtaining 602 at least one control bit identifying a symbol of a codeword of a vector signaling code. In response to obtaining the at least one control bit, the method sets 604 a line voltage on a transmission line. As shown, setting the line voltage may include selectively sourcing current 606 via at least one current source to the transmission line to drive a line voltage above a termination voltage $V_T$ of a termination voltage source connected to the transmission line via a termination impedance element Rterm, wherein each current source of the at least one current sources has an output impedance different than a characteristic impedance of the transmission line. In order to drive the line voltage below the termination voltage, the method may selectively sink 608 current via at least one current sink from the transmission line to drive a line voltage below the termination voltage $V_T$, each of the at least one current sinks having an output impedance different than the characteristic impedance of the transmission line.

In some embodiments, the termination impedance element Rterm is matched to the characteristic impedance of the transmission line. In some embodiments, at least one current source or at least one current sink is coupled to the transmission line via a transmit impedance, such as resistors $R_1$ and $R_2$ in FIGS. 1-3. In some embodiments, a current source and a current sink are coupled to the transmission line via a common transmit impedance, as shown in FIGS. 1 and 2, where a tri-state driver 110 is coupled to the transmission line 130 via transmit impedance $R_1$. In some embodiments, selectively sourcing or sinking current comprises enabling one or more switches according to the at least one control bit. Such an embodiment is illustrated by FIG. 3 utilizing switches 330, 340, 350, and 360. In some embodiments, at least one of the current sources is an active current source, such as Idd1 and Idd2 in FIG. 3. In some embodiments, at least one current sink is a passive current sink, illustrated by resistive current sinks $R_1$ and $R_2$ in FIG. 3.

In some embodiments, the method further includes selectively sourcing current to and sinking current from at least a second transmission line connected to the termination voltage source via a second termination impedance element, the current selectively sourced and sunk according to control bits identifying a second symbol of the codeword of the vector signaling code. In such an embodiment, multiple instances of a driver as shown in FIGS. 1-3 may have corresponding transmission lines connected to the termination voltage source providing $V_T$ via a respective termination impedance element $R_{term}$. Such an embodiment utilizing a multi-transmission line system is shown in FIG. 5. In some embodiments, the method further includes switching a single current source or current sink between the transmission line and the second transmission line. A switching circuit as illustrated by FIG. 4 may provide such a switching function, in which a reduced number of current sources are used and switched between each transmission line of the plurality of transmission lines. In some embodiments, the line voltage is set to one of at least three possible values.

Example signal levels, signal frequencies, and physical dimensions described herein are provided for purposes of explanation, and are not limiting. Different vector signaling codes may be used, communicated using more or fewer wires per group, fewer or greater numbers of signal levels per wire, and/or with different code word constraints. For convenience, signal levels are described herein as voltages, rather than their equivalent current values.

Other embodiments may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with some embodiments.

The examples presented herein illustrate the use of vector signaling codes carried by parallel transmission line interconnections for intra-chip and chip-to-chip communication. However, those exemplary details should not be seen as limiting the scope of the described embodiments. The methods disclosed in this application are equally applicable to other interconnection topologies and other communication media including optical, capacitive, inductive, and wireless communications which may rely on any of the characteristics of the described embodiments, including but not limited to communications protocol, signaling methods, and physical interface characteristics. Thus, descriptive terms such as "voltage" or "signal level" should be considered to include equivalents in other measurement systems, such as "current", "optical intensity", "RF modulation", etc. As used herein, the term "signal" includes any suitable behavior and/or attribute of a physical phenomenon capable of conveying information. The information conveyed by such signals may be tangible and non-transitory.

We claim:

1. An apparatus comprising:
a plurality of transmission lines having a length of up to 2 millimeters between first and second chips in a multi-chip package, each transmission line of the plurality of transmission lines connecting a respective multi-level driver of a plurality of multi-level drivers in the first chip to a voltage termination node in the second chip via a respective termination impedance element of a plurality of termination impedance elements and configured to carry a respective symbol of a balanced vector signaling codeword of a vector signaling code, the vector signaling code comprising codewords that have equal symbol values on at least two transmission lines of the plurality of transmission lines; and
each multi-level driver of the plurality of multi-level drivers configured to generate the respective symbol of the balanced vector signaling codeword by driving a line voltage of a respective transmission line of the plurality of transmission lines above or below a termination voltage of the voltage termination node by selectively enabling groups of current sources or current sinks, respectively, that responsively generate current through the respective termination impedance element, the selectively enabled groups of current sources or current sinks having an output impedance that is not matched to a characteristic impedance of the respective transmission line.

2. The apparatus of claim 1, wherein the plurality of transmission lines comprises 6 transmission lines.

3. The apparatus of claim 1, wherein the termination voltage on the voltage termination node is constant responsive to equal amounts of generated currents being sourced and sunk through the plurality of termination impedance elements.

4. The apparatus of claim 1, wherein the balanced vector signaling code comprises an alphabet of at least three values.

5. The apparatus of claim 4 wherein the alphabet of the balanced vector signaling code comprises the values [±1, ±⅓].

6. The apparatus of claim 1, wherein at least one multi-level driver of the plurality of multi-level drivers comprises a current source or a current sink selectively enabled to simultaneously generate current on two transmission lines of the plurality of transmission lines.

7. The apparatus of claim 1, wherein the groups of current sources or current sinks are selectively enabled via respective switching elements.

8. The apparatus of claim 1, wherein the characteristic impedance of the respective transmission line is matched to the respective termination impedance element.

9. The apparatus of claim 1, wherein at least one current sink in the selectively enabled group of current sinks comprises a passive current sink.

10. The apparatus of claim 9, wherein the passive current sink comprises a resistor selectively connected to the respective transmission line and to system ground.

11. A method comprising:
obtaining a plurality of control bits identifying a plurality of symbols of a balanced codeword of a vector signaling code, each symbol of the plurality of symbols of the balanced codeword having a symbol value selected from a set of at least three symbol values, the vector signaling code comprising codewords having equal symbol values on at least two transmission lines of a plurality of transmission lines having a length of up to 2 millimeters between first and second chips in a multi-chip package;
selectively enabling a group of current sources or current sinks in a multi-level driver of a plurality of multi-level drivers, the plurality of multi-level drivers connected to the plurality of transmission lines, the plurality of transmission lines coupled to a voltage termination node via a plurality of termination impedance elements, the group of current sources or current sinks selectively enabled according to the obtained plurality of control bits; and
the selectively enabled group of current sources or current sinks generating a respective symbol of the codeword by driving a line voltage of a respective transmission line of the plurality of transmission lines above or below a termination voltage of the voltage termination node, respectively, by generating current through a respective termination impedance element of the plurality of termination impedances, the selectively enabled group of current sources or current sinks having an output impedance that is not matched to a characteristic impedance of the respective transmission line.

12. The method of claim 11, wherein the plurality of transmission lines comprises 6 transmission lines.

13. The method of claim 11, wherein the termination voltage of the voltage termination node is constant responsive to equal amounts of generated currents being sourced and sunk through the plurality of termination impedance elements.

14. The method of claim 11, wherein the balanced vector signaling code comprises an alphabet of at least three values.

15. The method of claim 14, wherein the alphabet of the balanced vector signaling code comprises the values [±1, ±⅓].

16. The method of claim 11, further comprising selectively enabling a single current source or current sink to simultaneously source or sink current from two transmission lines of the plurality of transmission lines, respectively.

17. The method of claim 11, wherein the groups of current sources or current sinks are selectively enabled via respective switching elements receiving the plurality of control bits.

18. The method of claim 11, wherein the characteristic impedance of the respective transmission line is matched to the respective termination impedance element.

19. The method of claim 11, wherein at least one current sink in the selectively enabled group of current sinks comprises a passive current sink.

20. The method of claim 19, wherein the passive current sink comprises a resistor, and wherein the resistor is selectively connected to the respective transmission line and to system ground.

* * * * *